United States Patent [19]

Maurer et al.

[11] 4,264,830

[45] Apr. 28, 1981

[54] SWITCHING CIRCUIT FOR HIGH-VOLTAGE THYRISTORS

[75] Inventors: Franz Maurer, Schwieberdingen; Rainer Wirtz, Markgröningen; Eberhard Weiss, Hemmingen; Peter Zieher, Eberdingen, all of Fed. Rep. of Germany

[73] Assignee: Robert Bosch GmbH, Stuttgart, Fed. Rep. of Germany

[21] Appl. No.: 20,361

[22] Filed: Mar. 14, 1979

[30] Foreign Application Priority Data

Apr. 4, 1978 [DE] Fed. Rep. of Germany ....... 2814441

[51] Int. Cl.³ ........................................... H03K 17/72
[52] U.S. Cl. ................. 307/252 J; 307/311; 323/326
[58] Field of Search .............. 307/252 J, 252 N, 311, 307/363, 318; 323/225 C

[56] References Cited

U.S. PATENT DOCUMENTS

| 3,673,437 | 6/1972 | Wright | 307/252 J |
| 3,848,140 | 11/1974 | Guermeur et al. | 307/311 |
| 3,932,770 | 1/1976 | Fantozzi | 307/311 X |
| 3,967,138 | 6/1976 | Mitsuoka et al. | 307/252 J |

Primary Examiner—John Zazworsky
Attorney, Agent, or Firm—Frishauf, Holtz, Goodman & Woodward

[57] ABSTRACT

To turn a thyristor, particularly a high-voltage thyristor, ON, and to connect the thyristor and the utilization circuit to a power source, a charge capacitor is connected to a charging circuit to charge the capacitor when the thyristor is blocked or in OFF state. A controlled switch, typically a transistor 20, is connected to the charge capacitor 19 and connects the charge capacitor to the gate electrode of the thyristor, when the controlled switch is turned ON; a control circuit is connected to the controlled switch which includes an opto-coupler 28 to control its conduction. Preferably, a threshold sensitive element such as a Zener diode 25, or a four-layer diode 30, is included in the controlled switch transistor base circuit to provide for sharp turn-on characteristics. Since the conduction characteristics of the controlled switching transistor 20 will depend on the charge state of the capacitor 19, the controlled switching transistor will be conductive only when the capacitor has a sufficiently high charge for reliable firing of the thyristor.

6 Claims, 3 Drawing Figures

SWITCHING CIRCUIT FOR HIGH-VOLTAGE THYRISTORS

The present invention relates to a switching circuit for thyristors, and more particularly to a switching circuit in which high-voltage thyristors can be reliably turned ON to connect the power source to a load.

BACKGROUND AND PRIOR ART

It is well known to control the current flow to electrical loads, for example d-c loads, in accordance with control signals. For example, the field circuit of a shunt d-c dynamo electric machine for public transport use, for example for electric buses or other traction use can be connected directly to the catenary voltage, if the duty cycle of the current flow is controlled by a thyristor. The turn-off circuit for the thyristor can be in accordance with well known circuits of this type. For turn-on, however, it is necessary that the isolation between the thyristor and the thyristor control circuit can meet the highest requirements, due to safety reasons. For example, a leakage current of less than 1 mA is permitted at a test voltage of 9 kV for typical public use or public transit applications.

It has been proposed to control the thyristor by means of firing pulse transducers which have high insulation quality due to the presence of a shield winding. These thyristor firing arrangements, with a transformer, for example, require high manufacturing costs, are heavy, and have a limited transfer characteristic with respect to the speed or rate of rise of the firing pulse as well as of the voltage-time integral.

THE INVENTION

It is an object to provide an electronic firing control circuit for thyristors, and particularly for high-voltage thyristors which can operate directly at voltages from d-c supplies in the order of 600 V and more, which permit dynamic high-quality switching of the thyristor while providing effective isolation between the thyristor circuit and the control circuit as such, utilizing only few electronic components and, of those, components which are readily available in the market.

Briefly, a charge capacitor is coupled to a charging circuit to charge the capacitor when the thyristor is blocked or in its OFF state. A controlled switch, typically a transistor, is provided connecting the charge capacitor to the gate electrode of the thyristor. The transistor itself is controlled by a circuit which includes an opto-coupler, thus controlling conduction thereof.

The base voltage of the transistor is determined by the voltage on the charge capacitor, so that the transistor will become conductive only if the charge capacitor has received sufficient charge to ensure reliable firing of the thyristor; to preset this voltage, a circuit element with threshold characteristic, such as a Zener diode, a four-layer diode or the like is included in the base circuit of the transistor.

The arrangement has the substantial advantage that the thyristor can be fired by applying a firing pulse with high energy and, at the same time, reliably galvanically isolating the high-voltage circuit which includes the transistor from the control circuit as such, without requiring expensive components which are not stock articles of trade in the electronic field. The arrangement, in which the firing control switch is a transistor, has the additional advantage that it can readily be so connected to become conductive only if the firing energy available to fire the thyristor is sufficient to result in reliable conduction thereof. This arrangement then prevents dangerous conditions appearing at the thyristor, or only partial conduction due to marginal power at the gate circuit so that, under all conditions, the thyristor will be reliably fired for full conduction of saturation current.

The circuit can be readily arranged to include a positive qeedback circuit to further increase the gate current of the thyristor, and particularly to provide for a very steep switch-ON flank, thus decreasing the switching losses in the thyristor itself.

DRAWINGS, ILLUSTRATING EXAMPLES:

Figure 1:
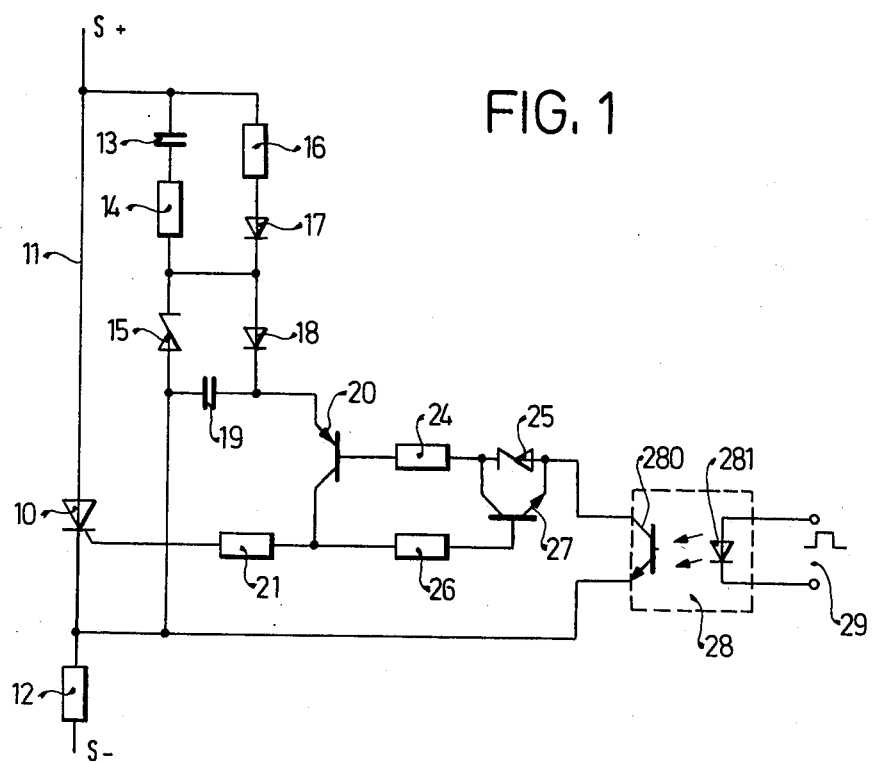
FIG. 1 is a highly schematic circuit diagram of the switching circuit for the thyristor using a Zener diode with a bridging transistor.

A thyristor 10 is connected to a supply line 11 which, for example, is connected between positive and negative supply terminals S+ and S−. A load 12 is serially connected in the main current carrying path of the thyristor 10. The load 12 is schematically shown as a resistor but may, for example, be the field winding of a shunt motor for a public service vehicle. A typical voltage between the terminals S+ and S− is, for example, 600 V. A protective circuit is connected in parallel to the thyristor, including the series circuit of a capacitor 13, a resistor 14 and a Zener diode 15. Capacitor 13 and resistor 14 are shunted by the series circuit of a resistor 16 and a diode 17. The Zener diode 15 is shunted by a diode 18, poled in reverse direction, and by a capacitor 19. Capacitor 19 forms the charging capacitor to supply the firing energy to the gate of the thyristor 10. The junction between the diode 18 and the capacitor 19 is connected to the emitter-collector path of a transistor 20 and through a resistor 21 to the gate electrode of the thyristor 10. The base or control electrode of the transistor 20 is connected through a resistor 24 and a Zener diode 25 to the output side 280 of an opto-coupler 28. The other terminal of the output side is connected to the cathode of the thyristor 10 and to the other electrode of the charge capacitor 19. The Zener diode 25 is bridged by the emitter-collector path of a transistor 27, the base of which receives current through a resistor 26 from the collector of transistor 20. The input circuit controlling conduction of thyristor 10 is formed by terminals 29 connected to the input portion 281 of opto-coupler 28.

Operation:

Let it be assumed that thyristor 10 is blocked. Charging current will flow to charge the charge capacitor 19 over the charge current for capacitor 13, resistor 14 on the one hand and over resistor 16, diode 17. Zener diode 15 limits the charge voltage to a value on the capacitor 19 which is insufficient to cause damage to any of the remaining circuit elements. The diode 18 is poled to prevent discharge of the capacitor 19 if a negative blocking voltage is applied to the thyristor 10. The diode 17 prevents return flow of current through resistor 16.

The capacitor 19 is now charged. Should thyristor 10 be fired, a pulse signal is applied to input terminal 29 of opto-coupler 28; the photo-coupler transistor in the output portion 280 of the opto-coupler 28 will be rendered conductive, causing transistor 20 to become conductive. Transistor 20, however, can become conductive only if the capacitor 19 has reached a sufficient charge state. Capacitor 19 discharges over the now conductive transistor 20 and resistor 21 into the gate electrode of the thyristor 10. This discharge is possible only if the charge voltage at the capacitor is so high that breakdown voltage of the Zener diode 25 is overcome. The voltage drop across limiting resistor 21 causes turn-ON of transistor 27 by transfer of a base voltage through transistor 26. As soon as transistor 27 becomes conductive, the Zener diode 25 is, effectively, shunted and the full remaining charge voltage of the capacitor 19 can be used to control the transistor 20 to maintain its conduction. Thus, the resistor 21 acts as a "boot strap" or positive feedback circuit which accelerates the turn-ON of the transistor 20 and thus improves the rate of rise of the leading or firing flank of the gate current pulse applied to the thyristor 10. Consequently, the turn-ON losses of the thyristor 10 are decreased. If, for example due to low voltage across terminals S+ and S−, or for other reasons, the capacitor 19 is insufficiently charged to effect reliable firing of the thyristor 10, the circuit additionally prevents firing of the thyristor. There is a minimum limit below which the gate current cannot go. The circuit then will not fire, but will hold the thyristor 10 in its OFF condition, although a controlled pulse may be present at terminals 29, until the charging capacitor 19 has been charged through resistor 16, diode 17, and diode 18 sufficiently to overcome the breakdown voltage of the Zener diode 25, indicating that a sufficient charge energy is available across capacitor 19. As mentioned above, a portion of the charge energy is then used to bypass the Zener diode 25 by rendering transistor 27 conductive, thereby ensuring rapid turn-ON of thyristor 10.

Figure 2:
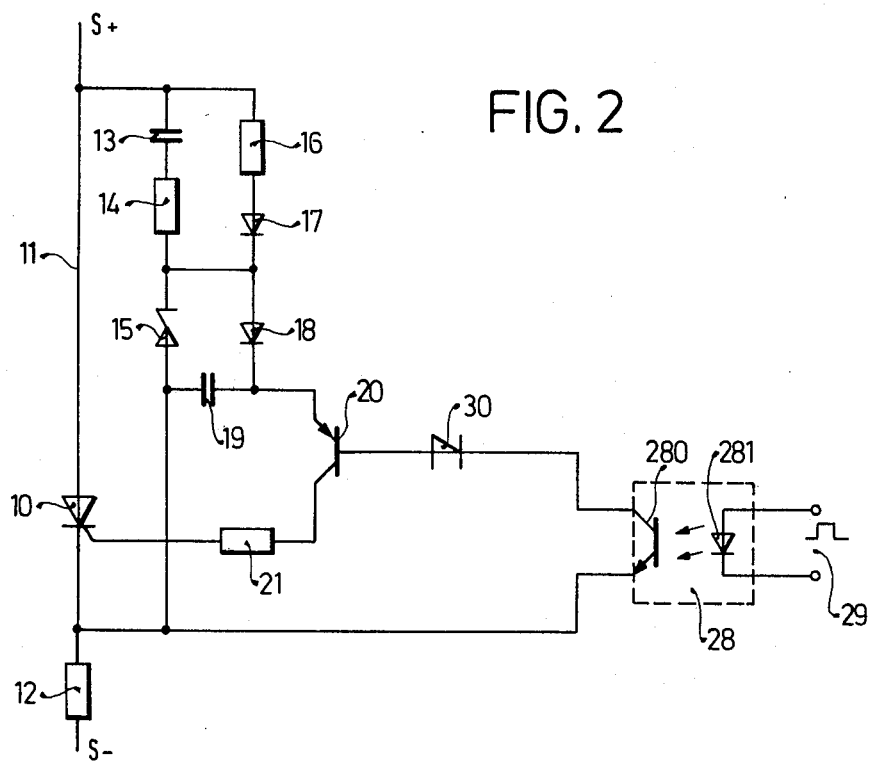
FIG. 2 is a similar circuit diagram using a four-layer diode.
Figure 3:
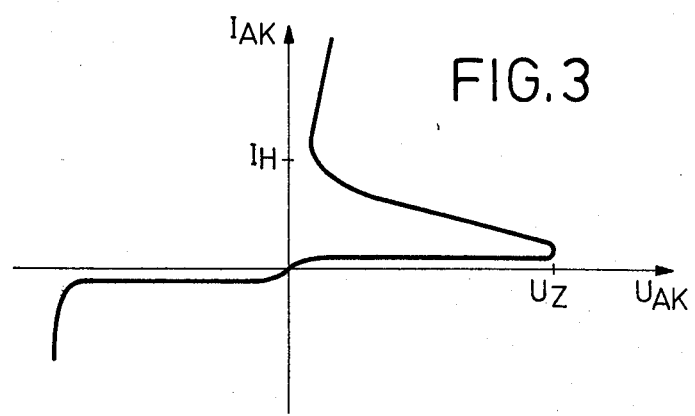
FIG. 3 is a current-voltage diagram of a four-layer diode and used in the explanation of the operation of the system.

Other elements than a Zener diode, and having threshold characteristics, can be used. Referring to FIG. 2, in which similar elements have been given the same reference numerals, a four-layer diode 30 is used in lieu of Zener diode 25. The four-layer diode avoids the necessity of a bridging transistor 27, since it has, inherently, a positive feedback characteristic. Upon breakdown, the voltage across the four-layer diode drops rapidly, as illustrated in the graph of FIG. 3. Thus, a positive feedback effect is obtained when the transistor 20 is to be rendered conductive as above described, that is, by applying a pulse to terminals 29. As best seen in FIG. 3, which shows a voltage (abscissa) current (ordinate) characteristic of a four-layer diode, the anode current $I_{AK}$ increases only very slightly as the voltage across the diode increases until a firing voltage $U_V$ is reached. At that point, the four-layer diode goes through a range of negative resistance until a holding current $I_H$ flows, from which point on the four-layer diode 30 will have a low positive resistance, that is, the curve of voltage-current will be very steep. Thus, turn-ON of transistor 20 can be obtained only if the breakdown voltage $U_Z$ is exceeded by the charge voltage across capacitor 19. When the charge voltage across capacitor 19 has reached the value of voltage $U_Z$, the resistance of the four-layer diode suddenly collapses so that, upon turn-ON of thyristor 10, a steep, sharp turn-ON pulse is available, decreasing switching losses therein.

In a typical circuit for a supply voltage of 600 V between terminals S+ and S− and a load having a d-c resistance of 90 k b2w 150 ohms, a charge capacitor 19 of 10 μF is suitable, combined with a breakdown element having a breakdown voltage characteristic, for example a firing voltage $U_Z$ of about 30 V.

Various changes and modifications may be made, and other elements than those shown may be used in the circuit, within the scope of the inventive concept.

We claim:

1. Switching circuit to turn ON a thyristor (10), particularly a high-voltage thyristor, under control of a pulse source (29) comprising
   a charge capacitor (19);
   a charging circuit (13-18) charging the capacitor when the thyristor is in blocked or OFF state;
   a transistor (20) having its emitter-collector path connected between the charge capacitor (19) and the gate electrode of the thyristor (10) for connecting the charge capacitor to the gate electrode when the transistor is controlled to conduction;
   a control circuit including an opto-coupler connected to the base of the transistor for controlling conduction of the transistor (20);
   and a threshold sensing element (25, 30) permitting control of the base circuit of said transistor to conduction, only if the charge voltage across the charge capacitor exceeds the threshold level of said threshold element.

2. Circuit according to claim 1 wherein the threshold element comprises a Zener diode (25).

3. Circuit according to claim 2, further including a controlled bridging switch (27) connected across said Zener diode (25) and controlled to conduction upon breakdown of the Zener diode.

4. Circuit according to claim 3, wherein said controlled bridging switch comprises a bridging transistor (27) having its base circuit connected to the emitter-collector circuit of the transistor (20) to render said bridging transistor (27) conductive upon conduction of the transistor (20) and hence short out the voltage drop across the Zener diode (25) once the transistor (20) has been rendered conductive upon initial breakdown of the Zener diode (25) when the voltage across the charge capacitor (19) has exceeded the breakdown voltage of the Zener diode.

5. Circuit according to claim 1, wherein the threshold element comprises a four-layer diode (30).

6. Circuit according to claim 1, wherein said threshold seasing element (25, 30) and said transistor (20) form a positive feedback circuit to cause rapid maximum conduction of said transistor when the threshold level of said threshold element is exceeded by the charge level across the charge capacitor (19).

* * * * *